United States Patent
Chan et al.

(10) Patent No.: US 7,015,076 B1
(45) Date of Patent: Mar. 21, 2006

(54) SELECTABLE OPEN CIRCUIT AND ANTI-FUSE ELEMENT, AND FABRICATION METHOD THEREFOR

(75) Inventors: Darin A. Chan, San Francisco, CA (US); Simon Siu-Sing Chan, Saratoga, CA (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 95 days.

(21) Appl. No.: 10/791,098

(22) Filed: Mar. 1, 2004

(51) Int. Cl.
*H01L 21/82* (2006.01)

(52) U.S. Cl. ............... 438/131; 438/467; 438/600; 438/630; 438/770; 257/530; 257/209

(58) Field of Classification Search ........ 438/131, 438/467, 468, 600; 257/530, 529
See application file for complete search history.

(56) References Cited

U.S. PATENT DOCUMENTS

| | | | | |
|---|---|---|---|---|
| 4,569,121 A | * | 2/1986 | Lim et al. | 438/467 |
| 4,670,970 A | * | 6/1987 | Bajor | 438/467 |
| 5,329,153 A | * | 7/1994 | Dixit | 257/530 |
| 6,051,851 A | * | 4/2000 | Ohmi et al. | 257/185 |
| 6,063,704 A | * | 5/2000 | Demirlioglu | 438/664 |
| 6,211,083 B1 | * | 4/2001 | Yang et al. | 438/682 |
| 6,339,021 B1 | * | 1/2002 | Tan et al. | 438/655 |
| 6,518,614 B1 | * | 2/2003 | Breitwisch et al. | 257/298 |
| 6,673,715 B1 | * | 1/2004 | Trivedi et al. | 438/655 |
| 6,853,049 B1 | * | 2/2005 | Herner | 257/529 |

* cited by examiner

*Primary Examiner*—George Eckert
*Assistant Examiner*—Mursalin B. Hafiz
(74) *Attorney, Agent, or Firm*—Mikio Ishimaru

(57) ABSTRACT

A method is provided of forming an integrated circuit with a semiconductor substrate that is doped with a set concentration of an oxidizable dopant of a type that segregates to the top surface of a silicide when the semiconductor substrate is reacted to form such a silicide. A gate dielectric is formed on the semiconductor substrate, and a gate is formed on the gate dielectric. Source/drain junctions are formed in the semiconductor substrate. A silicide is formed on the source/drain junctions and dopant is segregated to the top surface of the silicide. The dopant on the top surface of the segregated dopant is oxidized to form an insulating layer of oxidized dopant above the silicide. An interlayer dielectric is deposited above the semiconductor substrate. Contacts and connection points are then formed in the interlayer dielectric to the insulating layer of oxidized dopant above the silicide.

10 Claims, 4 Drawing Sheets

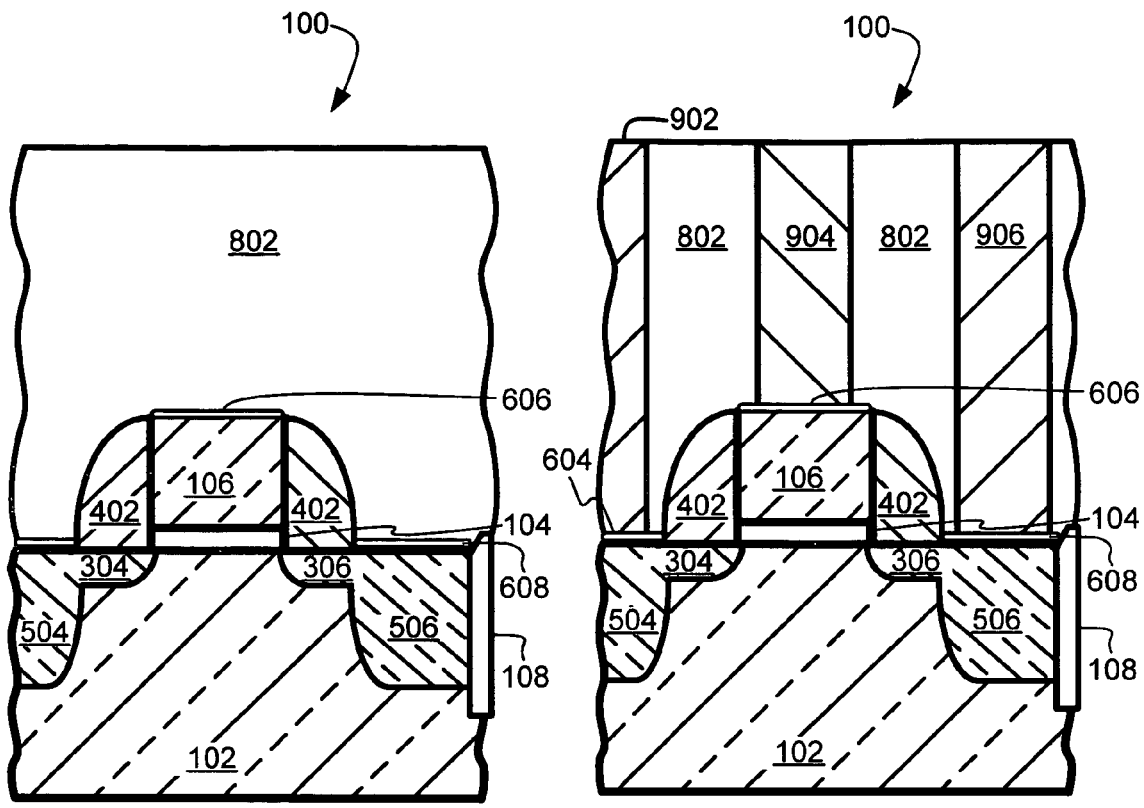
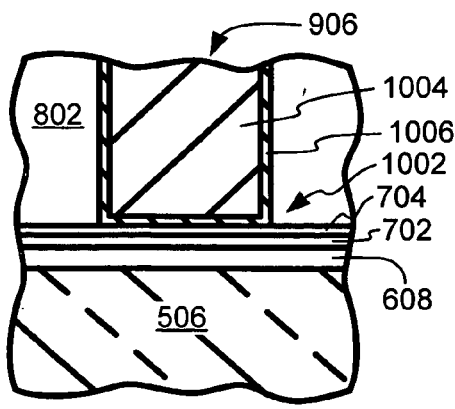
FIG. 10
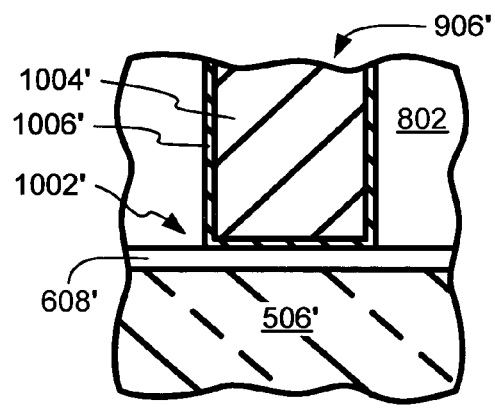
FIG. 11
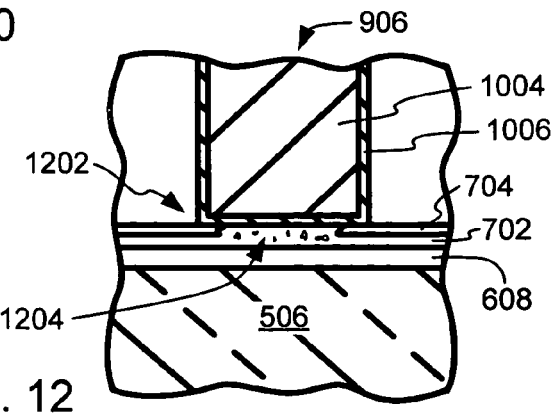
FIG. 12

SELECTABLE OPEN CIRCUIT AND ANTI-FUSE ELEMENT, AND FABRICATION METHOD THEREFOR

BACKGROUND

1. Technical Field

The present invention relates generally to semiconductor technology, and more specifically to siliciding in semiconductor devices.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped by ion implantation of boron or phosphorus impurity atoms into the surface of the silicon substrate, thereby becoming conductive. These lightly doped regions of the silicon substrate are referred to as "shallow source/drain junctions", which are separated by a channel region beneath the polysilicon gate.

A curved silicon oxide or silicon nitride spacer, referred to as a "sidewall spacer", on the sides of the polysilicon gate allows deposition of additional doping to form more heavily doped regions of the shallow source/drain ("S/D") junctions, which are called "deep S/D junctions". The shallow and deep S/D junctions together are collectively referred to as "S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one S/D contact through one S/D junction through the channel to the other S/D junction and to the other S/D contact.

As transistors have decreased in size, it has been found that the electrical resistance between the metal contacts and the silicon substrate or the polysilicon has increased to the level where it degrades the performance of the transistors. To lower the electrical resistance, a transition material is formed between the metal contacts and the silicon substrate or the polysilicon. The best transition materials have been found to be cobalt silicide ($CoSi_2$), nickel silicide (NiSi), platinum silicide (PtSi), and titanium silicide ($TiSi_2$).

The silicides are formed by first applying a thin layer of the transition material (e.g., cobalt, nickel, platinum, or titanium) on the silicon substrate above the S/D junctions and the polysilicon gates. The semiconductor wafer is subjected to one or more annealing steps at temperatures above 800° C. and this causes the transition material to selectively react with the silicon and the polysilicon to form the metal silicide. The process is generally referred to as "siliciding". Since the shallow trench oxide and the sidewall spacers will not react to form a silicide, the silicides are aligned over the S/D junctions and the polysilicon gates so the process is also referred to as "self-aligned siliciding", or "saliciding".

However, existing siliciding and saliciding have not succeeded in solving all the problems related to connecting metal contacts to silicon. For example, an n-type area that is heavily doped to a high concentration of arsenic (As) can result in As segregation into the top surface of the NiSi during silicide formation. This As-rich surface then has a propensity to form an insulating oxide that can cause random open circuits with subsequently formed contacts.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate that is doped with a set concentration of an oxidizable dopant of a type that segregates to the top surface of a silicide when the semiconductor substrate is reacted to form such a silicide. A gate is formed on the gate dielectric. Source/drain junctions are formed in the semiconductor substrate. A silicide is formed on the source/drain junctions and dopant is segregated to the top surface of the silicide. The dopant on the top surface of the segregated dopant is oxidized to form an insulating layer of oxidized dopant above the silicide. An interlayer dielectric is deposited above the semiconductor substrate. Contacts and connection points are then formed in the interlayer dielectric to the insulating layer of oxidized dopant above the silicide. The method allows programmed connection points and anti-fuse programmable elements to be constructed during early wafer processing.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 8 is the structure of FIG. 6 after deposition of an interlayer dielectric layer over the silicide, the sidewall spacer, and the shallow trench isolation;

FIG. 9 is the structure of FIG. 8 after formation of metal contacts;

FIG. 10 is an enlarged fragmentary view of the contact region and connection point between the silicide layer and the metal contact of FIG. 9;

FIG. 11 is a structure analogous to that of FIG. 10 for a contact area in a p-type semiconductor material;

FIG. 12 is the structure of FIG. 10 with the connection point configured to serve as an anti-fuse programmable element.

BEST MODE FOR CARRYING OUT THE INVENTION

Figure 1:
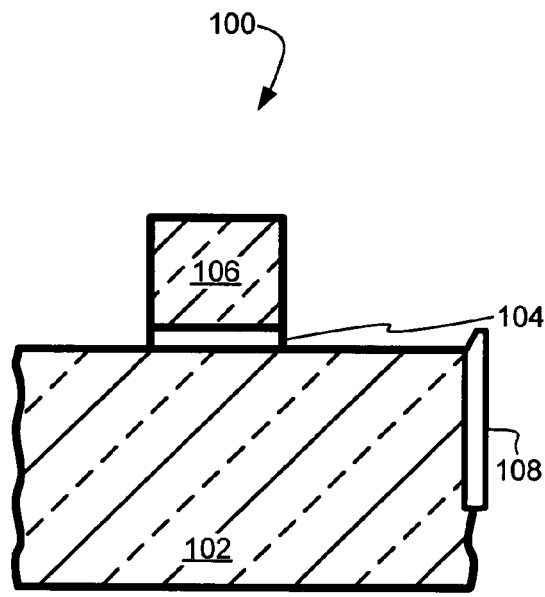
FIG. 1 is a view of a semiconductor integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a semiconductor integrated circuit, and in particular a transistor 100, in an intermediate stage of fabrication in accordance with the present invention.

To form the intermediate stage, a gate dielectric layer, such as silicon oxide, and a conductive gate layer, such as polysilicon, have been deposited on a semiconductor substrate 102 made of silicon (Si). The gate dielectric and the conductive gate layers are patterned and etched to form a gate dielectric 104 and a gate 106. The upper portions of the semiconductor substrate 102 are heavily doped with a high concentration of an n-type dopant (a donor dopant) to form an n-type semiconductor region. In one embodiment, the n-type dopant is arsenic (As), which is the donor of choice in many semiconductor manufacturing processes for very small geometry devices.

The semiconductor substrate 102 has also been patterned, etched, and filled with a silicon oxide material to form a shallow trench isolation ("STI") 108.

Figure 2:
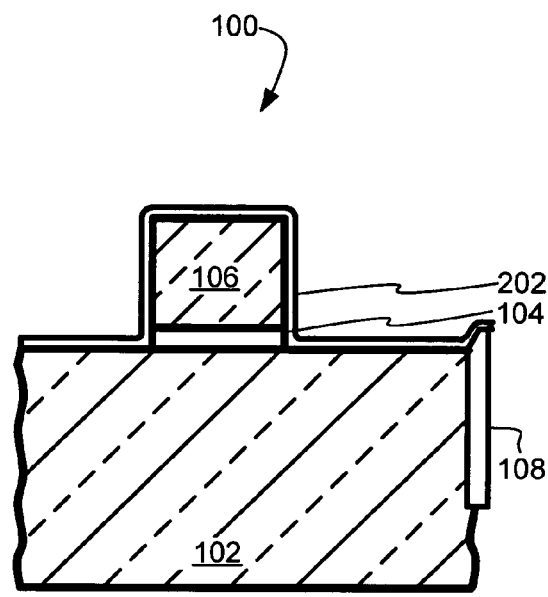
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
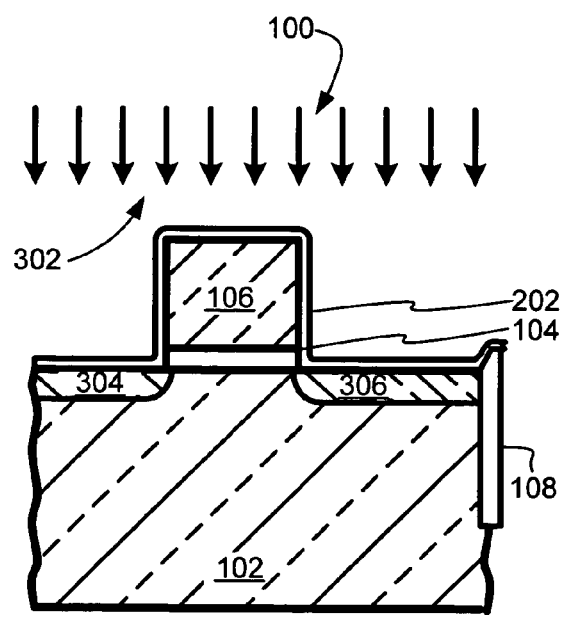
FIG. 3 is the structure of FIG. 2 during ion implantation to form shallow source/drain junctions.

Referring now to FIG. 3, therein is shown the structure of FIG. 2 during an ion implantation 302 to form shallow source/drain ("S/D") junctions 304 and 306. The gate 106 and the gate dielectric 104 act as masks for the formation of shallow S/D junctions 304 and 306 by the ion implantation 302 of impurity atoms into the surface of the semiconductor substrate 102. The ion implantation 302 is followed by a high-temperature anneal above 700° C. to activate the implanted impurity atoms to form the shallow S/D junctions 304 and 306.

Figure 4:
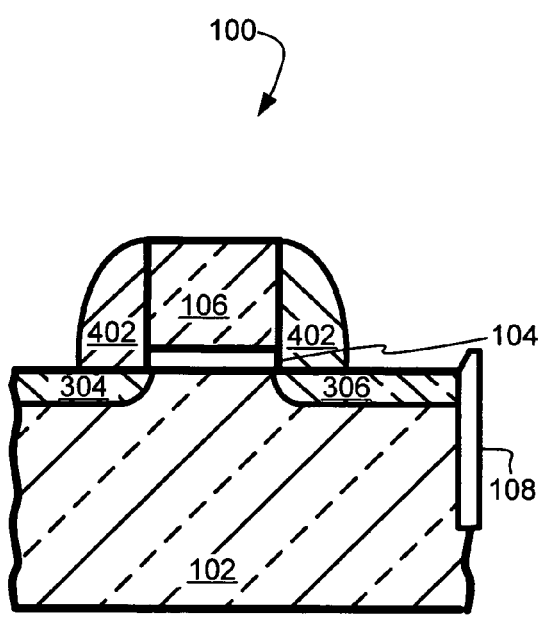
FIG. 4 is the structure of FIG. 3 after formation of a sidewall spacer.

Referring now to FIG. 4, therein is shown the structure of FIG. 3 after formation of a sidewall spacer 402. The liner layer 202, which protects from implant damage, has been removed and a sidewall spacer layer, generally of silicon nitride, has been deposited and etched to form the curved shape of the sidewall spacer 402.

Figure 5:
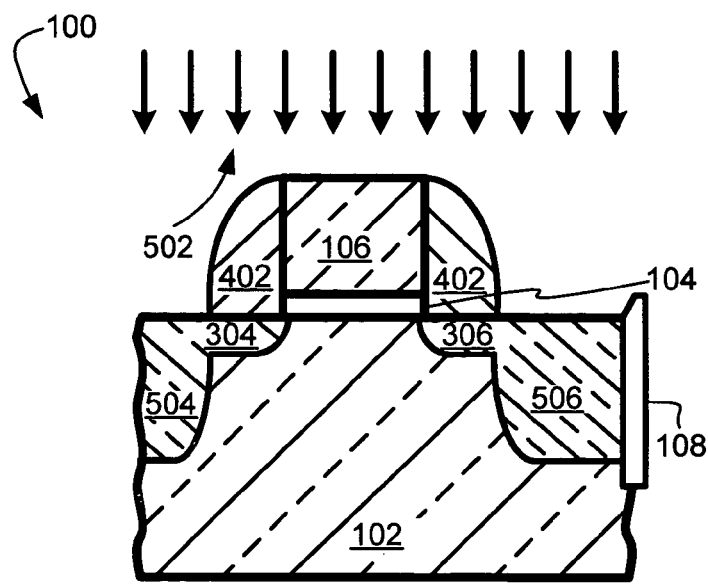
FIG. 5 is the structure of FIG. 4 during ion implantation to form deep source/drain junctions.

Referring now to FIG. 5, therein is shown the structure of FIG. 4 during an ion implantation 502 to form deep S/D junctions 504 and 506. The sidewall spacer 402, the gate 106, and the STI 108, act as masks for the formation of the deep S/D junctions 504 and 506 by the ion implantation 502 of impurity atoms into the surface of the semiconductor substrate 102 and into and through the shallow S/D junctions 304 and 306, respectively. The ion implantation 502 is again followed by a high-temperature anneal above 700° C. to activate the implanted impurity atoms to form the deep S/D junctions 504 and 506.

Figure 6:
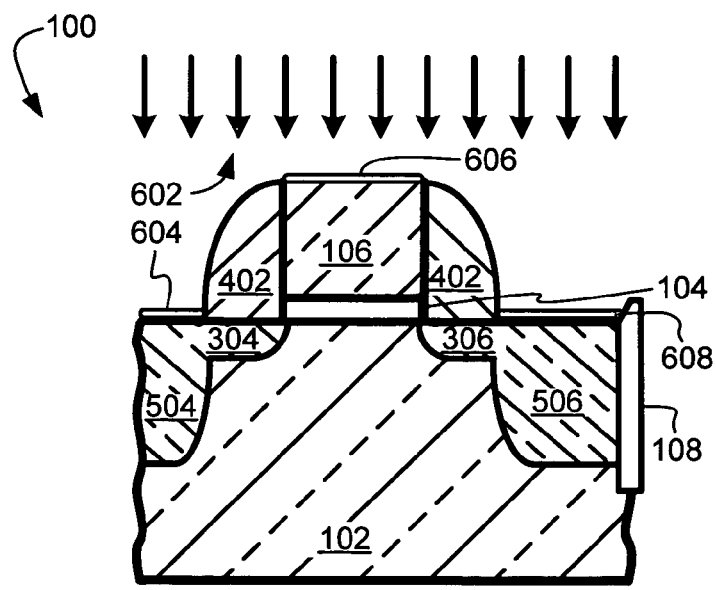
FIG. 6 is the structure of FIG. 5 during the formation of silicide.

Referring now to FIG. 6, therein is shown a nickel deposition process 602 used in the formation of NiSi silicide layers 604, 606, and 608 in accordance with the present invention. The silicide layers 604 and 608 are formed by reacting the nickel in known fashion with the surface of the semiconductor substrate 102 over the deep S/D junctions 504 and 506, respectively, and the silicide layer 606 is similarly formed on the gate 106. Arsenic is an oxidizable dopant of a type that segregates to the top surface of a silicide when the semiconductor substrate is reacted to form such a silicide. Thus, the formation of the silicide layers 604 and 608 into the As-rich Si of the semiconductor substrate 102 results in segregation of As to the top surface of the NiSi silicide of the silicide layers 604 and 608.

Figure 7:
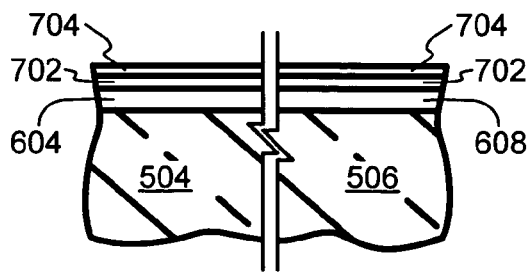
FIG. 7 is an enlarged view of fragments of the structure of FIG. 6.

Referring now to FIG. 7, therein is shown an enlarged view of fragments of the structure of FIG. 6 showing the As segregation into an As layer 702 on the top of the NiSi silicide layers 604 and 608. The As layer 702, from the formation of the silicide layers 604 and 608, has oxidized on the top thereof to form an arsenic oxide ($AsO_3$) surface layer 704 that comprises an insulating layer of oxidized dopant above the silicide layers 604 and 608.

Referring now to FIG. 8, therein is shown the structure of FIG. 6 after deposition of an interlayer dielectric layer 802 over the silicide layers 604, 606, and 608, the sidewall spacer 402, and the STI 108.

In various embodiments, the interlayer dielectric layer 802 is of dielectric materials such as silicon oxide ("$SiO_x$"), tetraethylorthosilicate ("TEOS"), borophosphosilicate ("BPSG") glass, etc., with dielectric constants from 4.2 to 3.9, or low dielectric constant dielectric materials such as fluorinated tetraethylorthosilicate ("FTEOS"), hydrogen silsesquioxane ("HSQ"), bis-benzocyclobutene ("BCB"), tetramethylorthosilicate ("TMOS"), octamethyleyclotetrasiloxane ("OMCTS"), hexamethyldisiloxane ("HMDS"), trimethylsilil borxle ("SOB"), diaceloxyditerliarybutosiloxane ("DADBS"), trimethylsilil phosphate ("SOP"), etc., with dielectric constants below 3.9 to 2.5. Available ultra-low dielectric constant dielectric materials, having dielectric constants below 2.5, include commercially available Teflon- AF, Teflon microemulsion, polimide nanofoams, silica aerogels, silica xerogels, and mesoporous silica. Stop layers and capping layers (where used) are of materials such as silicon nitride ("Si$_x$N$_x$") or silicon oxynitride ("SiON").

Referring now to FIG. 9, therein is shown the structure of FIG. 8 after formation of metal contacts 902, 904, and 906. The metal contacts 902, 904, and 906 are respectively electrically directed to the silicide layers 604, 606, and 608, and respectively then to the deep S/D junction 504, the gate 106, and the deep S/D junction 506.

In various embodiments, the metal contacts 902, 904, and 906 are of metals such as tantalum ("Ta"), titanium ("Ti"), tungsten ("W"), alloys thereof, and compounds thereof. In other embodiments, the metal contacts 902, 904, and 906 are of metals such as copper ("Cu"), gold ("Au"), silver ("Ag"), alloys thereof, compounds thereof, and combinations thereof with one or more of the above elements with diffusion barriers around them.

To complete the integrated circuits, the metal contacts 902, 904, and 906 are connected in conventional manner to additional levels of wiring (not shown) in additional levels of dielectric material (not shown) to the outside of the dielectric material.

Referring now to FIG. 10, therein is shown an enlarged fragmentary view of the contact region or the connection point 1002 between the silicide layer 608 and the metal contact 906 of FIG. 9. A typical plug contact configuration for the metal contact 906 is depicted, having, for example, a core 1004 of tungsten (W) within a barrier metal 1006 of titanium nitride (TiN) or titanium/titanium nitride (Ti/TiN). Due to the arsenic oxide surface layer 704, the contact quality of the connection point 1002 between the silicide layer 608 and the metal contact 906 is very poor—in fact, in this case it is electrically open.

Referring now to FIG. 11, therein is shown a structure analogous to that of FIG. 10 for a contact area above a deep S/D junction 506' of low As concentration. In this case, there is no segregated dopant above the silicide and no intervening insulating arsenic oxide layer between the silicide layer 608' and the metal contact 906'. Accordingly, the connection point 1002' between the silicide layer 608' and the metal contact 906' is good, and the circuit is electrically closed.

It is a feature of the present invention that the insulating arsenic oxide layer can thus be deliberately controlled to deliberately form an open or a closed circuit when desired. This provides for controllably forming programmed open or closed connection points during the wafer fabrication process. For example, masking for an As implantation into the semiconductor substrate 102 can be utilized to form regions where the As implant concentration is set sufficiently low to avoid causing an arsenic/arsenic oxide layer formation at silicidation. The resulting programmed connection point between the silicide layer and the metal contact will be electrically closed.

Alternatively, masking for an As implantation into the semiconductor substrate 102 can be utilized to form regions where the As implant concentration is set sufficiently high to cause insulating arsenic/arsenic oxide layer formation on the silicide layer during or after silicidation. The resulting programmed connection point between the silicide layer and the metal contact will then be electrically open, such as depicted by the connection point 1002 in FIG. 10.

It will be understood that such low and high As concentration regions can be simultaneously fabricated, as needed, to simultaneously form some connection points that are closed and others that are open. The selective and controlled implantation would then be configured to increase the As concentration in those regions where open connection points are to be formed, and not to increase the As concentration in regions where closed connection points are to be formed. Such selective and controlled As implantation can be done, for example, with appropriate masking and implantation in process steps performed in conjunction with, and thus as an extended part of, the ion implantation 502 (FIG. 5) for the deep S/D junctions 504 (FIG. 5) and 506 (FIG. 5).

The invention thus provides an easily controlled method to create programmed connection points at an early stage during wafer processing. This is a significant advantage over typical processes in which programmed connection points are made at much later contact or metal mask levels, rather than at early implantation stages as taught and disclosed herein.

Referring now to FIG. 12, therein is shown the structure of FIG. 10 in which the connection point has been configured to serve as an anti-fuse programmable element 1202. The anti-fuse programmable element 1202 is formed, for example, in the same manner as the connection point 1002 (FIG. 10). Under normal conditions, the circuit through the anti-fuse programmable element 1202 is then similarly open. But at any time, including following fabrication of the semiconductor integrated circuit, the anti-fuse programmable element 1202 can be converted to a closed circuit by selectively applying an appropriately high voltage and current through the anti-fuse programmable element 1202. This breaks up the oxide layer 704 to form an electrical closed circuit 1204 between the silicide layer 608 and the metal contact 906. This affords an easily controlled method to create anti-fuse programmable elements at an early stage during wafer processing.

Figure 13:
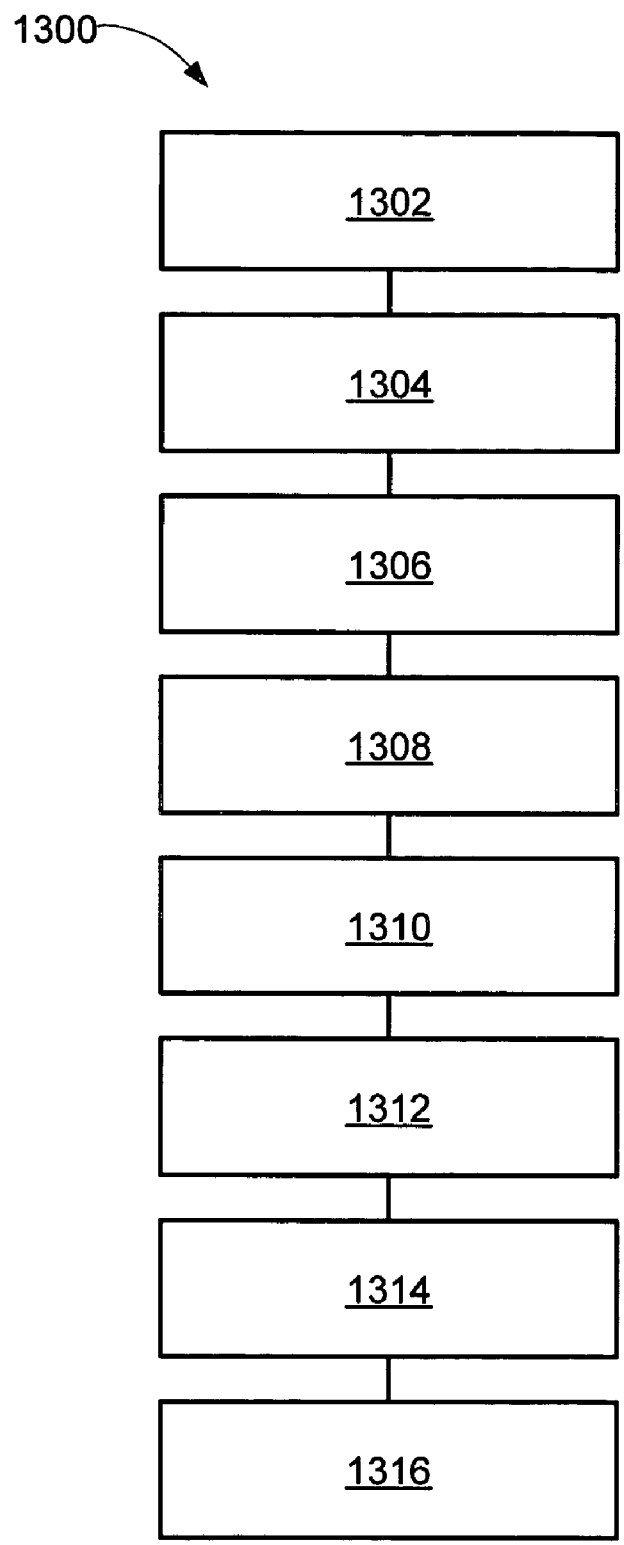
FIG. 13 is a simplified flow chart of the method of forming an integrated circuit in accordance with the present invention.

Referring now to FIG. 13, therein is shown a simplified flow chart of a method 1300 of forming an integrated circuit in accordance with the present invention. The method 1300 includes: providing, in a block 1302, a semiconductor substrate that is doped with a set concentration of an oxidizable dopant of a type that segregates to the top surface of a silicide when the semiconductor substrate is reacted to form such a silicide; forming a gate dielectric on the semiconductor substrate in a block 1304; forming a gate on the gate dielectric in a block 1306; forming source/drain junctions in the semiconductor substrate in a block 1308; forming a silicide on the source/drain junctions and segregating dopant to the top surface of the silicide in a block 1310; oxidizing the dopant on the top surface of the segregated dopant to form an insulating layer of oxidized dopant above the silicide in a block 1312; depositing an interlayer dielectric above the semiconductor substrate in a block 1314; and forming contacts and connection points in the interlayer dielectric to the insulating layer of oxidized dopant above the silicide in a block 1316.

It has been discovered, therefore, that the present invention has numerous advantages. One such advantage is that, by choice and control of implants, programmed connection points can be constructed during early wafer processing rather than later during contact or metal mask levels.

Another advantage is the similar ready ability to form anti-fuse programmable elements. These elements, that are normally open-circuit, can then be later selectively closed, for example by applying a high voltage and current through selected open-circuit interfaces to form respective electrical closed circuits.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method of forming an integrated circuit comprising:
providing a semiconductor substrate that is doped with a set concentration of an oxidizable dopant of a type that segregates to the top surface of a silicide when the semiconductor substrate is reacted to form such a silicide;
forming a gate dielectric on the semiconductor substrate;
forming a gate on the gate dielectric;
forming source/drain junctions in the semiconductor substrate;
forming a silicide on the source/drain junctions and segregating dopant to the top surface of the silicide;
oxidizing the dopant on the top surface of the segregated dopant to form an insulating layer of oxidized dopant above the silicide;
depositing an interlayer dielectric above the semiconductor substrate; and
forming contacts and connection points in the interlayer dielectric to the insulating layer of oxidized dopant above the silicide.

2. The method as claimed in claim 1 wherein forming contacts and connection points further comprises simultaneously forming closed connection points and open connection points.

3. The method as claimed in claim 1 further comprising:
configuring at least a portion of the insulating layer of oxidized dopant as anti-fuse programmable elements; and
forming an electrical closed circuit through at least one of the anti-fuse programmable elements.

4. The method as claimed in claim 1 wherein the semiconductor substrate is a silicon substrate that is doped with a set concentration of arsenic dopant to form an n-type semiconductor region.

5. The method as claimed in claim 1 wherein forming the contacts in the interlayer dielectric to the insulating oxide layer above the silicide uses materials selected from a group consisting of tantalum, titanium, tungsten, copper, gold, silver, an alloy thereof, a compound thereof, and a combination thereof.

6. A method of forming an integrated circuit comprising:
providing a semiconductor substrate that is doped with a set concentration of an oxidizable dopant of a type that segregates to the top surface of a silicide when the semiconductor substrate is reacted to form such a silicide;
forming a gate dielectric on the semiconductor substrate;
forming a gate on the gate dielectric;
forming source/drain junctions in the semiconductor substrate and low and high concentration regions therein of the oxidizable dopant;
forming a silicide on the source/drain junctions and on the gate, and segregating dopant from the high concentration regions to the top surface of the silicide on the source/drain junctions;
oxidizing the dopant on the top surface of the segregated dopant on the source/drain junctions to form an insulating layer of oxidized dopant above the silicide;
depositing an interlayer dielectric above the semiconductor substrate; and
forming contacts and connection points in the interlayer dielectric to the insulating layer of oxidized dopant above the high concentration regions, and to the silicide above the low concentration regions.

7. The method as claimed in claim 6 wherein forming contacts and connection points further comprises simultaneously forming closed connection points above the low concentration regions and open connection points above the high concentration regions.

8. The method as claimed in claim 6 further comprising:
configuring at least a portion of the insulating layer of oxidized dopant as anti-fuse programmable elements; and
forming an electrical closed circuit through at least one of the anti-fuse programmable elements.

9. The method as claimed in claim 6 wherein the semiconductor substrate is a silicon substrate that is doped with a set concentration of arsenic dopant to form an n-type semiconductor region.

10. The method as claimed in claim 6 wherein forming the contacts to the insulating layer of oxidized dopant and to the silicide further comprises forming cores within a barrier metal using materials selected from a group consisting of tantalum, titanium, tungsten, copper, gold, silver, an alloy thereof, a compound thereof, and a combination thereof.

* * * * *